(12) United States Patent
Balakrishnan et al.

(10) Patent No.: US 11,704,183 B2
(45) Date of Patent: *Jul. 18, 2023

(54) DATA INTEGRITY FOR PERSISTENT MEMORY SYSTEMS AND THE LIKE

(71) Applicant: Advanced Micro Devices, Inc., Santa Clara, CA (US)

(72) Inventors: Kedarnath Balakrishnan, Bangalore (IN); James R. Magro, Lakeway, TX (US); Kevin Michael Lepak, Austin, TX (US); Vilas Sridharan, Brookline, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/544,074

(22) Filed: Dec. 7, 2021

(65) Prior Publication Data
US 2022/0091921 A1 Mar. 24, 2022

Related U.S. Application Data

(63) Continuation of application No. 16/705,913, filed on Dec. 6, 2019, now Pat. No. 11,200,106.

(30) Foreign Application Priority Data
Aug. 12, 2019 (IN) .............................. 201911032592

(51) Int. Cl.
*G06F 11/07* (2006.01)
*H03M 13/29* (2006.01)
*G06F 11/10* (2006.01)

(52) U.S. Cl.
CPC ...... *G06F 11/0772* (2013.01); *G06F 11/0727* (2013.01); *G06F 11/0751* (2013.01);
(Continued)

(58) Field of Classification Search
CPC ............ G06F 11/0772; G06F 11/0727; G06F 11/0751; G06F 11/1004; G06F 11/1068; H03M 13/29
(Continued)

(56) References Cited

U.S. PATENT DOCUMENTS 11,200,106 B2 * 12/2021 Balakrishnan ...... G06F 11/0772
2007/0226588 A1    9/2007 Lee et al.
(Continued)

OTHER PUBLICATIONS

International Search Report and Written Opinion for International Application No. PCT/US2020/042608, dated Oct. 26, 2020, 13 pages.

*Primary Examiner* — Yair Leibovich
(74) *Attorney, Agent, or Firm* — Polansky & Associates, P.L.L.C.; Paul J. Polansky

(57) ABSTRACT

A data processor includes provides memory commands to a memory channel according to predetermined criteria. The data processor includes a first error code generation circuit, a second error code generation circuit, and a queue. The first error code generation circuit generates a first type of error code in response to data of a write request. The second error code generation circuit generates a second type of error code for the write request, the second type of error code different from the first type of error code. The queue is coupled to the first error code generation circuit and to the second error code generation circuit, for provides write commands to an interface, the write commands including the data, the first type of error code, and the second type of error code.

20 Claims, 7 Drawing Sheets

(52) U.S. Cl.
CPC ...... *G06F 11/1004* (2013.01); *G06F 11/1068* (2013.01); *H03M 13/29* (2013.01)

(58) Field of Classification Search
USPC .......................................................... 714/54
See application file for complete search history.

(56) References Cited

U.S. PATENT DOCUMENTS

| | | |
|---|---|---|
| 2012/0124294 A1 | 5/2012 | Atkisson et al. |
| 2013/0346695 A1 | 12/2013 | Loh et al. |
| 2015/0205665 A1* | 7/2015 | Kuo .................... G06F 11/1048 714/773 |
| 2018/0018221 A1 | 1/2018 | Magro et al. |
| 2018/0293012 A1 | 10/2018 | Khatri et al. |
| 2019/0079827 A1 | 3/2019 | Nguyen et al. |
| 2019/0108147 A1 | 4/2019 | Dropps |

\* cited by examiner

DATA INTEGRITY FOR PERSISTENT MEMORY SYSTEMS AND THE LIKE

This application is a continuation of U.S. patent application Ser. No. 16/705,913, filed Dec. 6, 2019, and entitled "Data Integrity for Persistent Memory Systems and the Like," which is incorporated by reference herein in its entirety.

BACKGROUND

Computer systems typically use inexpensive and high-density dynamic random access memory (DRAM) chips for main memory. Most DRAM chips sold today are compatible with various double data rate (DDR) DRAM standards promulgated by the Joint Electron Devices Engineering Council (JEDEC). DDR memory controllers are used to manage the interface between various memory accessing agents and DDR DRAMs according to published DDR standards.

A non-volatile dual-inline memory module with persistent storage ("NVDIMM-P") is a storage class memory that will take the place of standard DDR DIMMs but include persistent memory to retain important data when the power is removed or lost. However, these memories have non-deterministic access latencies and may have on-board media management activities that may temporarily delay the access to the non-volatile memory, and thus these memories require a handshake protocol to inform the host controller about the availability of data from the NVDIMM-P. JEDEC is developing a standard for an NVDIMM-P transactional protocol to mitigate the performance impact of this non-determinism, and to provide capabilities to enable out-of-order transactions and the ability to stack commands. Current drafts of this standard specify a data integrity capability known as "Link ECC" (link error correcting code) to detect and potentially correct errors on the link that would otherwise cause erroneous operation or program failure.

Figure 1:
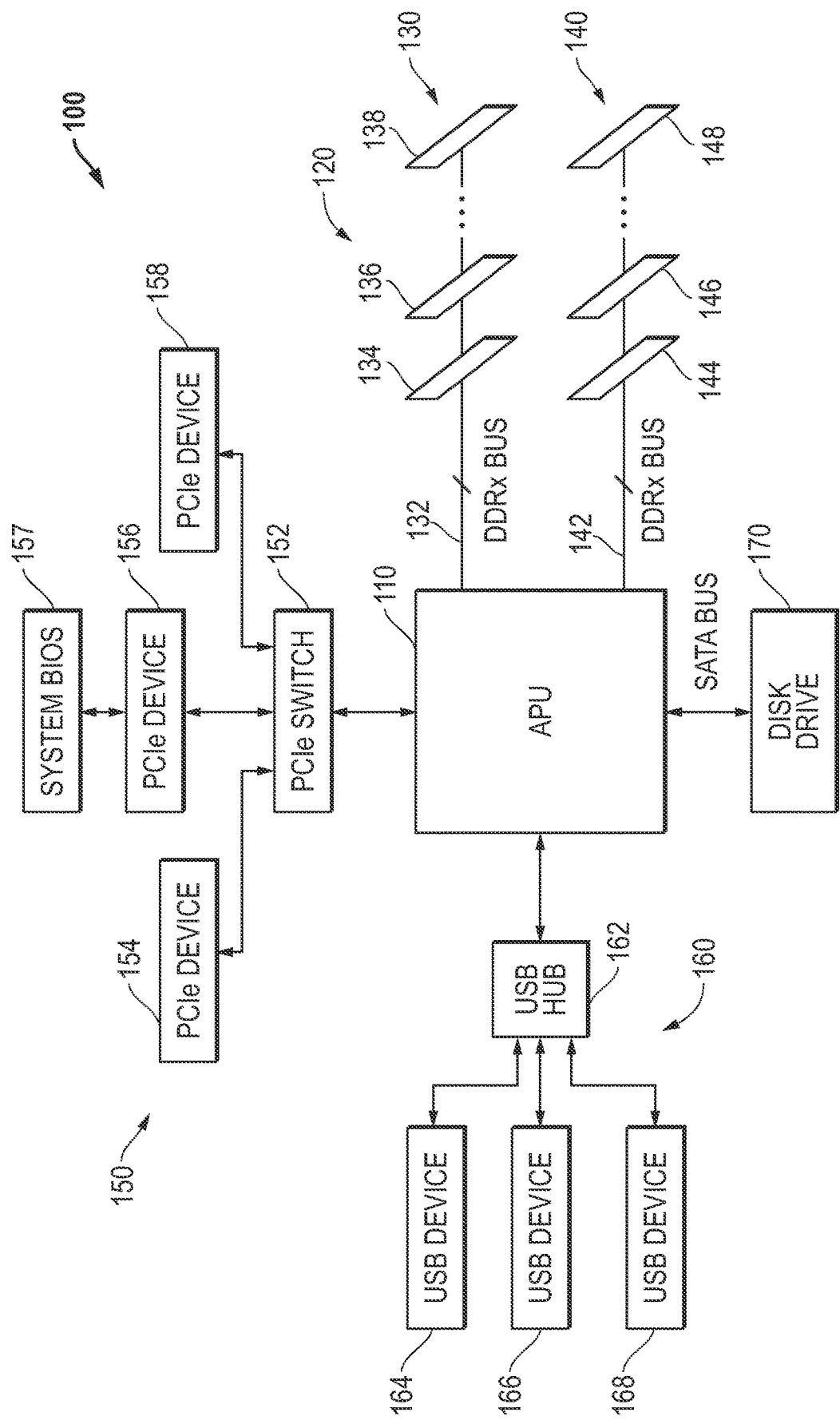
FIG. 1 illustrates in block diagram form a data processing system known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A data processor includes provides memory commands to a memory channel according to predetermined criteria. The data processor includes a first error code generation circuit, a second error code generation circuit, and a queue. The first error code generation circuit generates a first type of error code in response to data of a write request. The second error code generation circuit generates a second type of error code for the write request, the second type of error code different from the first type of error code. The queue is coupled to the first error code generation circuit and to the second error code generation circuit, for provides write commands to an interface, the write commands including the data, the first type of error code, and the second type of error code.

A data processing system includes a memory channel, a memory coupled to the memory channel, and a data processor. The data processor is coupled to the memory channel and accesses the memory using a packet structure defining a plurality of commands and having corresponding address bits, data bits, and user bits. The data processor communicates with the memory over the memory channel using a first type of error code, and calculates a second type of error code different from the first type of error code and appends each bit of the second type of error code as a corresponding one of the user bits. The memory stores the user bits in response to a write command, and transfers the user bits to the data processor in a read response packet in response to a read command.

A method of writing data from a data processor to a memory device on a memory channel includes receiving a write request. A first type of error code is generated according to the write request. A second type of error code different from the first type of error code is generated according to the write request. A write packet having corresponding address bits, corresponding data bits, corresponding first error code bits of the first type of error code in a predetermined error correcting code (ECC) field, and corresponding second error code bits of the second type of error code in a predetermined user bit field is formed. The write packet is transferred to the memory device over the memory channel.

FIG. 1 illustrates in block diagram form a data processing system 100 known in the prior art. Data processing system 100 includes generally a data processor 110 in the form of an accelerated processing unit (APU), a memory system 120, a peripheral component interconnect express (PCIe) system 150, a universal serial bus (USB) system 160, and a disk drive 170. Data processor 110 operates as the central processing unit (CPU) of data processing system 100 and provides various buses and interfaces useful in modern computer systems. These interfaces include two double data rate (DDRx) memory channels, a PCIe root complex for connection to a PCIe link, a USB controller for connection to a USB network, and an interface to a Serial Advanced Technology Attachment (SATA) mass storage device.

Memory system 120 includes a memory channel 130 and a memory channel 140. Memory channel 130 includes a set of dual inline memory modules (DIMMs) connected to a DDRx bus 132, including representative DIMMs 134, 136, and 138 that in this example correspond to separate ranks. Likewise, memory channel 140 includes a set of DIMMs connected to a DDRx bus 142, including representative DIMMs 144, 146, and 148.

PCIe system 150 includes a PCIe switch 152 connected to the PCIe root complex in data processor 110, a PCIe device 154, a PCIe device 156, and a PCIe device 158. PCIe device 156 in turn is connected to a system basic input/output system (BIOS) memory 157. System BIOS memory 157 can be any of a variety of non-volatile memory types, such as read-only memory (ROM), flash electrically erasable programmable ROM (EEPROM), and the like.

USB system 160 includes a USB hub 162 connected to a USB master in data processor 110, and representative USB devices 164, 166, and 168 each connected to USB hub 162. USB devices 164, 166, and 168 could be devices such as a keyboard, a mouse, a flash EEPROM port, and the like.

Disk drive 170 is connected to data processor 110 over a SATA bus and provides mass storage for the operating system, application programs, application files, and the like.

Data processing system 100 is suitable for use in modern computing applications by providing a memory channel 130 and a memory channel 140. Each of memory channels 130 and 140 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high-speed operation. At the same time, they also provide low power modes to save power for battery-powered applications such as laptop computers, and also provide built-in thermal monitoring.

Figure 2:
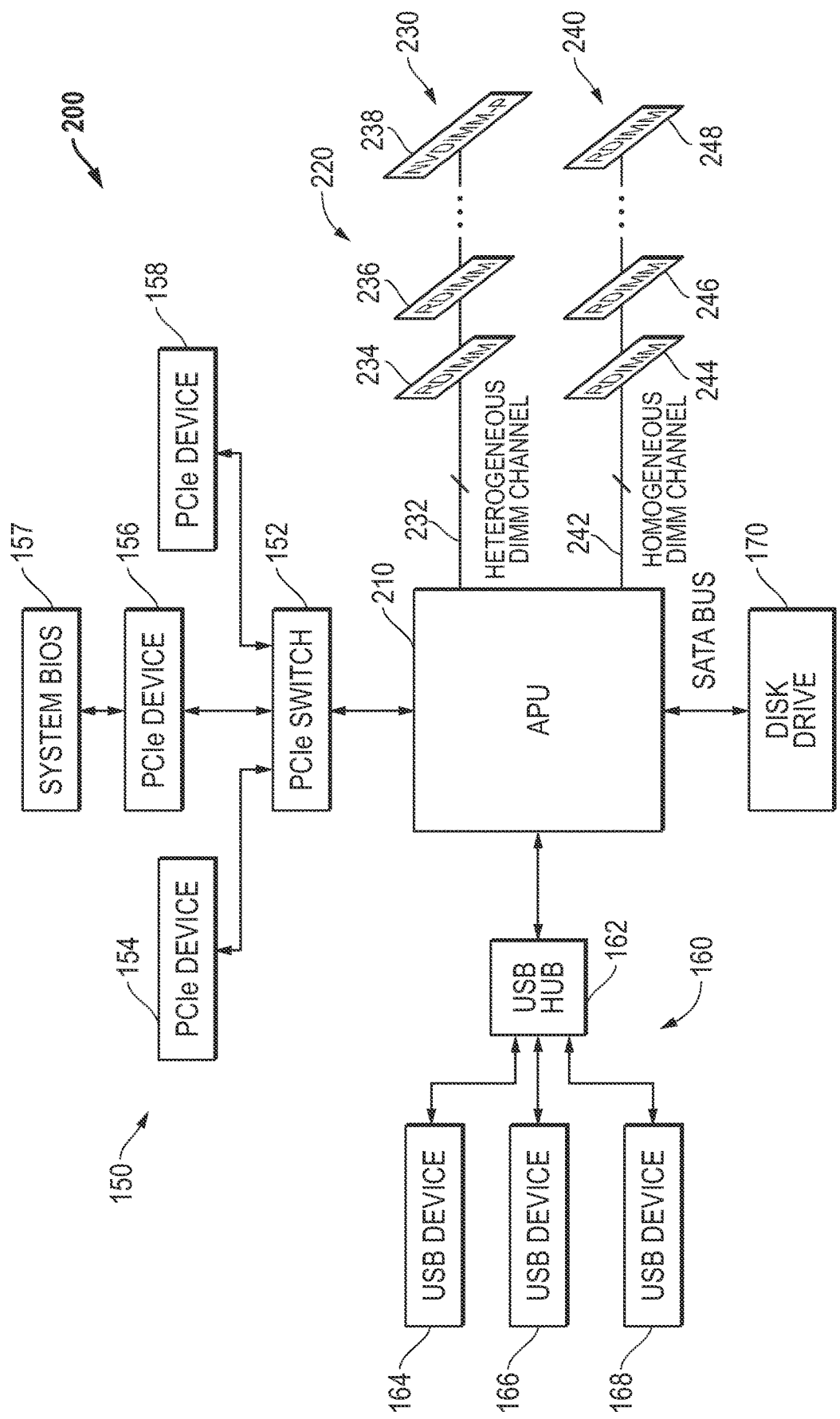
FIG. 2 illustrates in block diagram form a data processing system according to some embodiments.

FIG. 2 illustrates in block diagram form a data processing system 200 according to some embodiments. Data processing system 200 is similar to data processing system 100 of FIG. 1 except that it includes memory channels with enhanced capabilities and a data processor 210 capable of accessing them. Data processing system 200 includes a memory system 220 and a modified data processor 210 in the form of an APU to interface to it. In addition to normal DDRx memory channels, data processor 210 is capable of accessing NVDIMM-P 238 on a heterogeneous memory channel 230 having both normal DDR4 registered DIMMs (RDIMMs) 234 and 236 and NVDIMM-P 238, in addition to a homogeneous memory channel 240 having only RDIMMs 244, 246, and 248. Note that in other examples, a heterogeneous memory channel can be formed with other types of DRAM memory, including load-reduced DIMMs (LRDIMMs), three-dimensional (3-D) stacked DIMMs, and the like.

According to the draft NVDIMM-P standard, transactions between the memory controller on data processor 210 and NVDIMM-P 238 are protected by "Link ECC". Link ECC ensures data integrity for the data transfer between the memory controller and the NVDIMM over bus 232. In accordance with known ECC mechanisms, it protects against data corruption on the link caused by a random or transient error in any of the bits of the packet. The protection varies according to the ECC code used. The ECC may allow, for example, single-bit error correction with multiple-bit error detection. In response to detecting an uncorrectable error, the memory controller in data processor 210 can replay the transaction because a transient or random error will not persist, and can also report both correctable and uncorrectable errors to the operating system.

While the Link ECC is able to correct some errors by single-bit correction or link replay, multiple-bit errors cannot be corrected through the ECC mechanism alone. Moreover, the ECC mechanism cannot prevent errors that occur on the DIMM itself, such as a single bit failure in the memory on NVDIMM-P 238—in either normal high-density DRAM such as DDR4 DRAM, or persistent memory such as any of various types of non-volatile memory.

Figure 3:
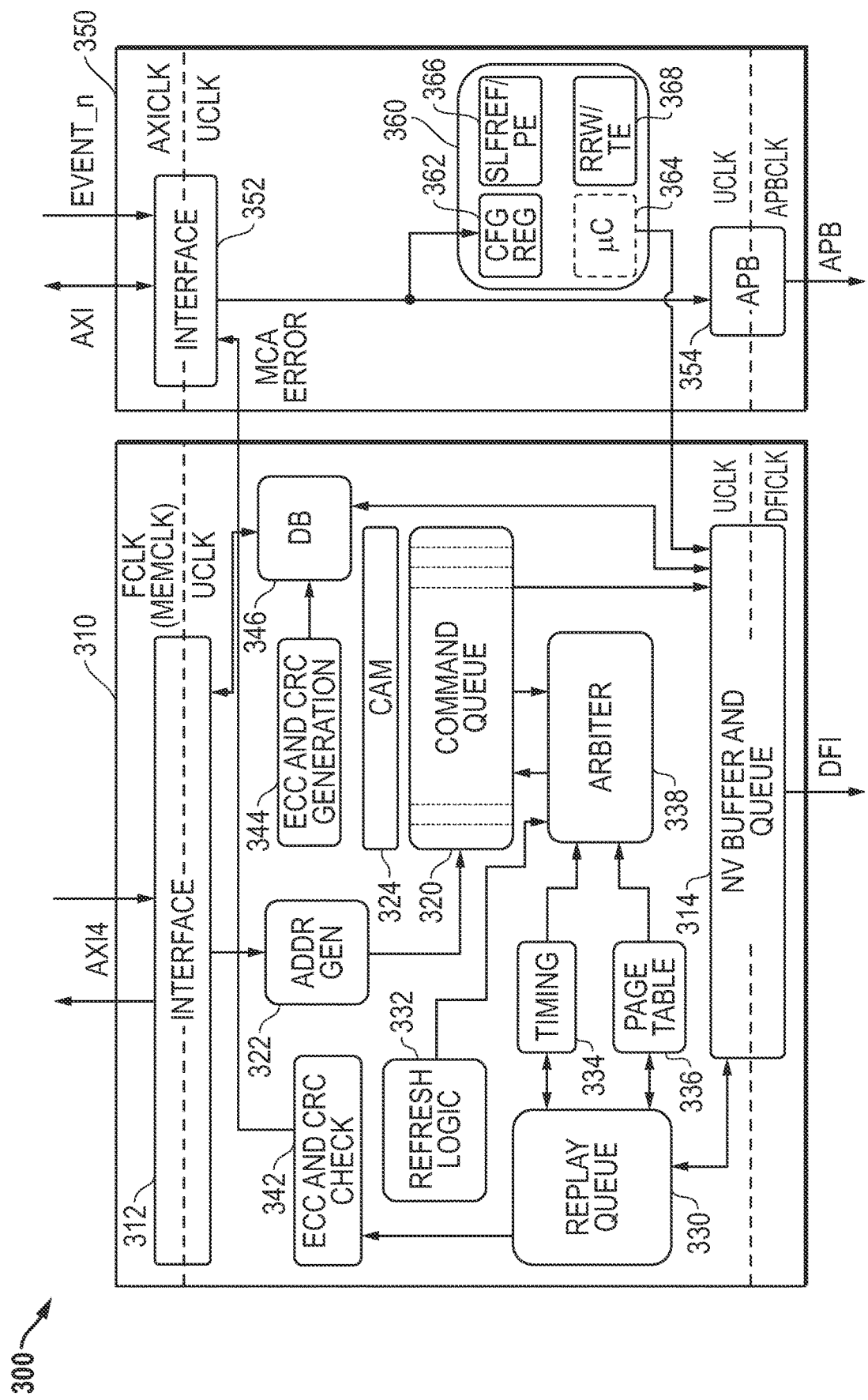
FIG. 3 illustrates in block diagram form a memory controller that can be used in the data processor of FIG. 2.

FIG. 3 illustrates in block diagram form a memory controller 300 that can be used in data processor 210 of FIG. 2. Memory controller 300 includes generally a memory channel controller 310 and a power controller 350. Memory channel controller 310 includes generally an interface 312, a queue and NVDIMM-P sequencer 314, a command queue 320, an address generator 322, a content addressable memory (CAM) 324, a replay queue 330, a refresh logic block 332, a timing block 334, a page table 336, an arbiter 338, an ECC and cyclic redundancy check (CRC) check circuit 342, an ECC and CRC generation block 344, and a data buffer (DB) 346.

Interface 312 has a first bidirectional connection to a data fabric labeled "AXI4" over an external bus, and has a second bidirectional connection. In memory controller 300, this external bus is compatible with the advanced extensible interface version four (i.e., AXI4) specified by ARM Holdings, PLC of Cambridge, England, but can be other types of interfaces in other embodiments. Interface 312 translates memory access requests from a first clock domain known as the FCLK (or MEMCLK) domain to a second clock domain internal to memory controller 300 known as the UCLK domain. Similarly, queue and NVDIMM-P sequencer 314 provides memory accesses from the UCLK domain to the DFICLK domain associated with the DDR-PHY (DFI) interface.

Address generator 322 decodes addresses of memory access requests received from the data fabric over the AXI4 bus. The memory access requests include access addresses in the physical address space represented in a normalized format. Address generator 322 converts the normalized addresses into a format that can be used to address the actual memory devices in memory system 120, as well as to efficiently schedule related accesses. This format includes a region identifier that associates the memory access request with a particular rank, a row address, a column address, a bank address, and a bank group in the case of DDR4 DRAM, or with an NVDIMM-P region. On startup, the system BIOS queries the memory devices in memory system 120 to determine their size and configuration, and programs a set of configuration registers associated with address generator 322. Address generator 322 uses the configuration stored in the configuration registers to translate the normalized addresses into the appropriate format. Command queue 320 is a queue of memory access requests received from the memory accessing agents in data processing system 100, such as a CPU core or a graphics core. Command queue 320 stores the address fields decoded by address generator 322 as well other address information that allows arbiter 338 to select memory accesses efficiently, including access type and quality of service (QoS) identifiers. CAM 324 includes information to enforce ordering rules, such as write after write (WAW) and read after write (RAW) ordering rules.

Replay queue 330 is a temporary queue for storing memory accesses picked by arbiter 338 that are awaiting responses, such as address and command parity responses, write cyclic redundancy check (CRC) responses for DDR4 DRAM or write and read CRC responses for gDDR5 DRAM. Replay queue 330 accesses ECC and CRC check circuit 342 to determine whether the returned ECC is correct or indicates an error. Replay queue 330 allows the accesses to be replayed in the case of a parity or CRC error of one of these cycles.

Refresh logic block 332 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh logic block 332 generates refresh commands periodically to prevent data errors caused by leaking of charge off storage capacitors of memory cells in DRAM chips. In addition, refresh logic block 332 periodically calibrates ZQ to prevent mismatch in on-die termination resistance due to thermal changes in the system.

Arbiter 338 is bidirectionally connected to command queue 320 and is the heart of memory channel controller 310. It improves efficiency by intelligent scheduling of accesses to improve the usage of the memory bus. Arbiter 338 uses timing block 334 to enforce proper timing relationships by determining whether certain accesses in command queue 320 are eligible for issuance based on DRAM timing parameters. For example, each DRAM has a minimum specified time between activate commands, known as "$t_{RC}$". Timing block 334 maintains a set of counters that determine eligibility based on this and other timing parameters specified in the JEDEC specification, and is bidirectionally connected to replay queue 330. Page table 336 maintains state information about active pages in each bank and rank of the memory channel for arbiter 338, and is bidirectionally connected to replay queue 330.

In response to write memory access requests received from interface 312, ECC and CRC generation circuit 344 computes an ECC according to the write data. DB 346 stores the write data and ECC for received memory access requests. It outputs the combined write data/ECC to queue and NVDIMM-P sequencer 314 when arbiter 338 picks the corresponding write access for dispatch to the memory channel.

Power controller 350 generally includes an interface 352 to an advanced extensible interface, version one (AXI), an advanced peripheral bus (APB) interface 354, and a power engine 360. Interface 352 has a first bidirectional connection to a system management network (SMN), which includes an input for receiving an event signal labeled "EVENT_n" shown separately in FIG. 3, and an output. APB interface 354 has an input connected to the output of interface 352, and an output for connection to a PHY over an APB. Power engine 360 has an input connected to the output of interface 352, and an output connected to an input of queue and NVDIMM-P sequencer 314. Power engine 360 includes a set of configuration registers 362, a microcontroller (µC) 364, a self refresh controller (SLFREF/PE) 366, and a reliable read/write timing engine (RRW/TE) 368. Configuration registers 362 are programmed over the AXI bus, and store configuration information to control the operation of various blocks in memory controller 300. Accordingly, configuration registers 362 have outputs connected to these blocks that are not shown in detail in FIG. 3. Self refresh controller 366 is an engine that allows the manual generation of refreshes in addition to the automatic generation of refreshes by refresh logic block 332. Reliable read/write timing engine 368 provides a continuous memory access stream to memory or I/O devices for such purposes as DDR interface maximum read latency (MRL) training and loopback testing.

Memory channel controller 310 includes circuitry that allows it to pick memory accesses for dispatch to the associated memory channel. In order to make the desired arbitration decisions, address generator 322 decodes the address information into predecoded information including rank, row address, column address, bank address, and bank group in the memory system, and command queue 320 stores the predecoded information. Configuration registers 362 store configuration information to determine how address generator 322 decodes the received address information. Arbiter 338 uses the decoded address information, timing eligibility information indicated by timing block 334, and active page information indicated by page table 336 to efficiently schedule memory accesses while observing other criteria such as QoS requirements. For example, arbiter 338 implements a preference for accesses to open pages to avoid the overhead of precharge and activation commands required to change memory pages, and hides overhead accesses to one bank by interleaving them with read and write accesses to another bank. In particular during normal operation, arbiter 338 normally keeps pages open in different banks until they are required to be precharged prior to selecting a different page.

Memory controller 300 is similar to a memory controller that would be used in APU 110 of FIG. 1, but with the following differences. First, memory controller 300 includes an ECC and CRC check circuit 342 that replaces a simple ECC check circuit. ECC and CRC check circuit 342 not only checks the received ECC against the incoming ECC, but it also checks a CRC generated according to the received data, or generated according to the received data, address, and metadata, to the received CRC for end-to-end integrity checking. In response to a read response packet, ECC and CRC check circuit 342 provides a CRC code using a polynomial described below. Memory controller 300 uses ECC and CRC generation circuit 344 to generate the CRC and send it to the NVDIMM-P. The NVDIMM-P stores the CRC by extracting the USER bits from the received write data packet and returns the CRC along with the corresponding DATA to memory controller 300 in USER bits of a read response packet.

Second, an address generator 322 replaces a corresponding address generator that would be used by data processor 110. Address generator 322 additionally decodes the address range of the NVDIMM-P memory and stores a decoded signal indicating that the memory access request is a request to NVDIMM-P in command queue 320. Arbiter 338 can then prioritize the NVDIMM-P requests with appropriate priority relative to other requests.

Third, an ECC and CRC generation circuit 344 replaces a corresponding ECC generation circuit that would be used by data processor 110. ECC and CRC generation circuit 344 not only determines the ECC of WRITE DATA to be sent to the NVDIMM-P, but also generates a CRC for the entire packet for end-to-end data integrity checking.

Fourth, queue and NVDIMM-P sequencer 314 replaces a corresponding queue that would be used by data processor 110. Queue and NVDIMM-P sequencer 314 includes queues of sufficient depth to compensate for the higher latency of persistent memory systems like NVDIMM-P, or in some embodiments, separate queues for DRAM and NVDIMM-P accesses.

These differences and the operation and advantages of memory controller 300 will now be examined.

Figure 4:
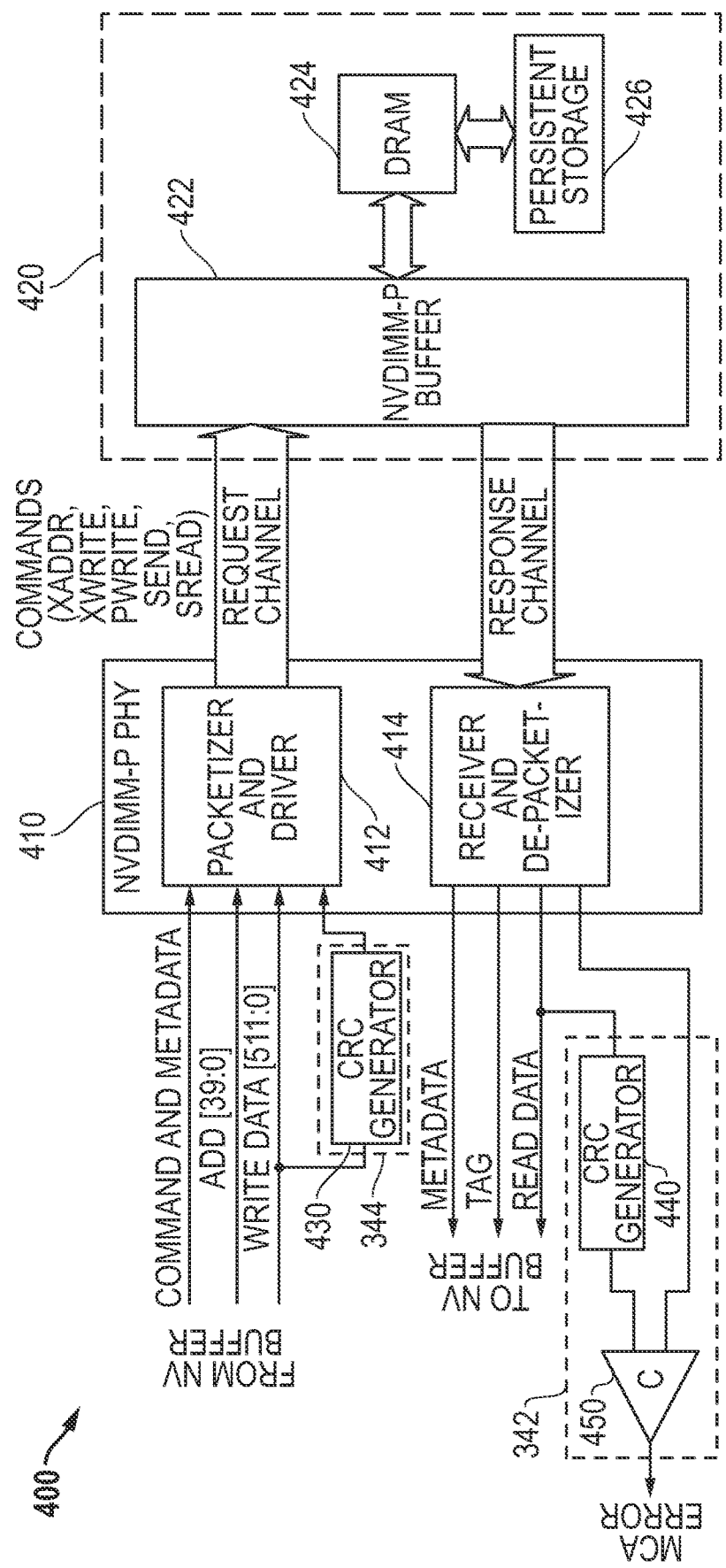
FIG. 4 illustrates in block diagram form a portion of the data processing system of FIG. 2 showing further details of the memory controller and the persistent memory according to some embodiments.

FIG. 4 illustrates in block diagram form a portion 400 of data processing system 200 of FIG. 2 showing further details of the memory controller and the persistent memory according to some embodiments. Portion 400 includes an NVDIMM-P physical layer interface (PHY) 410, an NVDIMM-P 420, a CRC generator 430 portion of ECC and CRC generation circuit 344, a CRC generator 440 of ECC and CRC generation circuit 344, and a comparator 450 of ECC and CRC generation circuit 344. NVDIMM-P PHY 410 includes a packetizer and driver 412, and a receiver and de-packetizer 414. Packetizer and driver 412 has a first input for receiving a command and metadata, a second input for receiving an address labeled "ADDR[39:0]", a third input for receiving write data labeled "WRITE DATA[511:0]", a fourth input, and an output port for providing commands to a REQUEST CHANNEL. CRC generator 430 has an input for receiving the WRITE DATA [511:0], and an output connected to the fourth input of packetizer and driver 412. Receiver and de-packetizer 414 has an input connected to a RESPONSE CHANNEL, a first output for providing a signal labeled "METADATA", a second output for providing a TAG (corresponding to an address), a third output for providing READ DATA, and a fourth output for providing a received CRC.

NVDIMM-P 420 includes an NVDIMM-P buffer 422, a dynamic random access memory (DRAM) 424, and a persistent storage 426. NVDIMM-P buffer 422 has a request channel input port connected to the output port of packetizer and driver 412, a bidirectional internal port, and a channel output port connected to the RESPONSE CHANNEL. DRAM 424 has a first bidirectional port connected of NVDIMM-P buffer 422, and a second bidirectional port connected to persistent storage 426.

In operation, FIG. 4 is a system that adds end-to-end data integrity checking to the Link ECC specified in the draft NVDIMM-P standard. In this example, the data integrity is checked on just the data itself, i.e. WRITE DATA[511:0] sent in a write data packet. Thus CRC generator 430 uses the WRITE DATA[511:0] alone to generate the CRC. CRC generator 430 provides the CRC to packetizer and driver 412 to insert it into certain bits of the write data packet known as USER bits. The proposed NVDIMM-P standard defines six USER bits that are user-defined metadata. The write data packet is sent with other information over the request channel to NVDIMM-P buffer 422. NVDIMM-P buffer 422 does Link ECC checking and error reporting after receiving the write data packet. However it also stores the six USER bits in either an internal buffer, DRAM 424, or persistent storage 426.

In response to a read command, NVDIMM-P buffer 422 provides a data response packet according to the NVDIMM-P protocol. It reads the six CRC bits from an internal buffer, DRAM 424, or persistent storage 426, and appends them as the six corresponding USER bits of the data response packet. It sends the data response packet over the RESPONSE CHANNEL to receiver and depacketizer 414, which extracts the various fields including READ DATA, TAG, and METADATA. CRC generator 440 receives the READ DATA and generates a 6-bit CRC, which it provides to the first input of comparator 450. Receiver and depacketizer 414 also sends to extracted CRC field to a second input of comparator 450. Comparator 450 compares the two CRC values and provides the MCA ERROR signal to a system management network (SMN). The MCA ERROR is eventually received by a system management unit (SMU), not shown, that generates an appropriate interrupt to report the error in software.

In an embodiment referenced above, replay queue 330 also accesses the results of both the Link ECC and the CRC to determine whether to replay the command in response to the parity error or CRC error.

Figure 5:
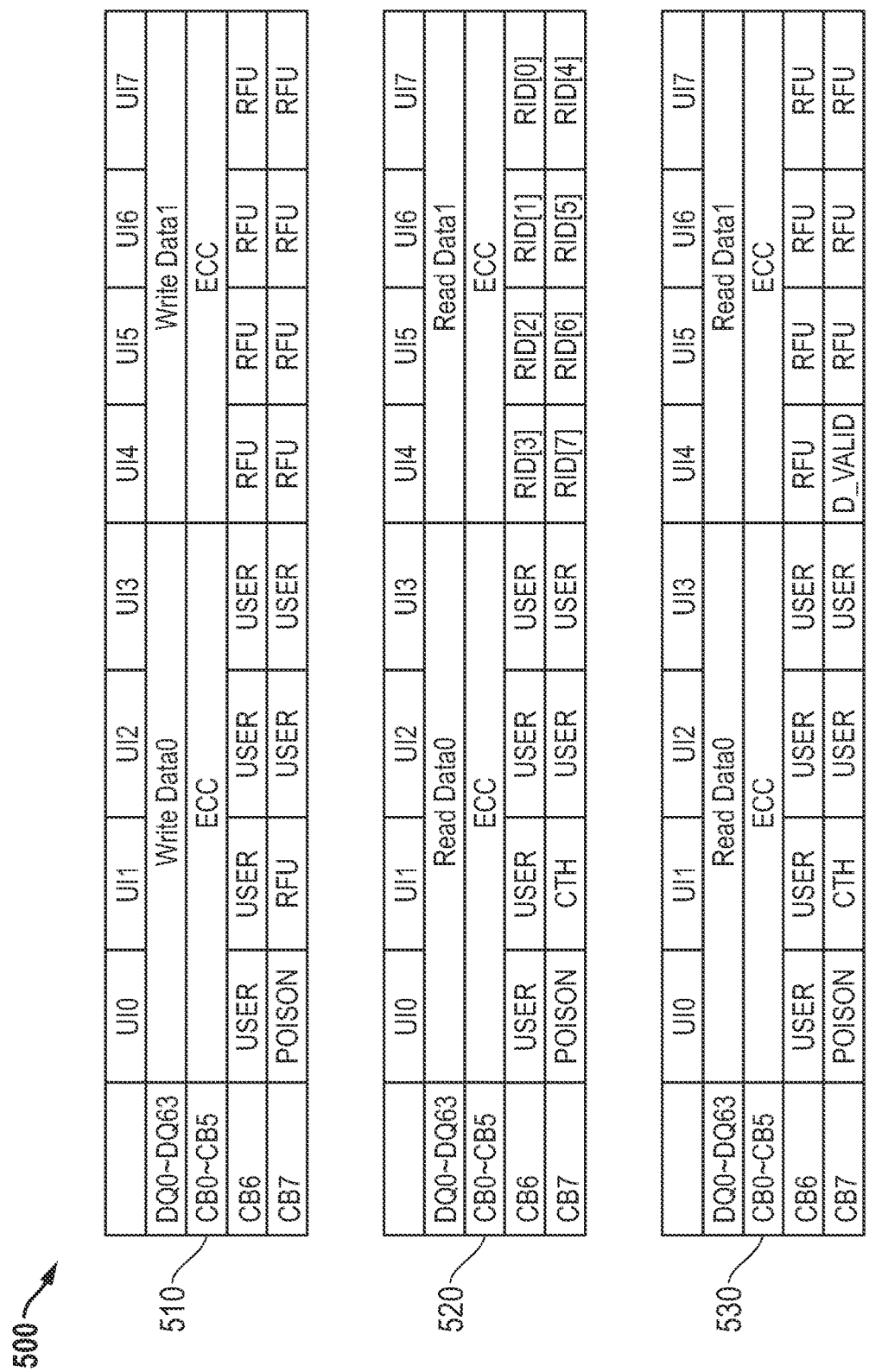
FIG. 5 shows data packet formats for a proposed NVDIMM-P standard that support link integrity checks known in the prior art.

FIG. 5 shows data packet formats for a proposed NVDIMM-P standard that supports link integrity checks known in the prior art. An NVDIMM-P supports several commands defined by the standard. Some of the commands relate to data transfer, i.e. reads and writes, and the NVDIMM-P protocol supports Link ECC to protect data and associated metadata from random errors on the data bus. The memory controller sends each command using address and command signals that are mapped onto pre-existing DDR4 address and command signals, making this format compatible with DDR4 devices and enabling a heterogeneous bus having both DDR4 and NVDIMM-P memory, as shown in FIG. 2 above. Transfer of data occurs with data packets generated with or in response to data transfer commands. An NVDIMM-P system supports three data packet formats: an XWRITE (transactional write) or PWRITE (persistent write) packet 510, a SEND response packet 520, and an SREAD (speculative read) response packet 530.

XWRITE or PWRITE packet 510 is sent from the memory controller to the NVDIMM-P over a 64-bit data channel DQ0-DQ63 that contains the write data for one data element in four consecutive unit intervals (UIs). Thus two 256-bit write data words WRITE DATA0 and WRITE DATA1 are transferred during a single XWRITE or PWRITE packet. An XWRITE or PWRITE packet also contains check bits (CB) consisting of eight check bits, CB0-CB7, that are used to transfer metadata about the packet, in which "USER" indicates optional user-defined data, and "POISON" indicates metadata about the integrity of the data. As can be seen in FIG. 5, the WRITE and PWRITE commands provide six bits of ECC data on the CB0-CB5 channels for each UI of the packet accompanying the write data. There are also several reserved bits labelled "RFU".

SEND response packet 520 includes data returned by the NVDIMM-P a deterministic amount of time after a SEND packet is sent from the controller. The memory controller issues the SEND command after previously issuing an XREAD (transactional read) command and receiving a response ready signal from the NVDIMM-P indicating the NDIMM-P is ready to send the data. The XREAD command has a non-deterministic access latency since the NVDIMM-P will either have the requested data available in the DRAM and activate the response ready signal after receiving the XREAD packet, or will need to fetch the data from the slow non-volatile memory and place it in the DRAM or buffer before the access can be completed with a SEND command. SEND response packet 520 has a 64-bit data channel DQ0-DQ63 that contains the read data for one data element in four consecutive unit intervals (UIs). Thus two 256-bit read data words READ DATA0 and READ DATA1 are transferred during a single SEND response packet. SEND response packet 520 uses CB0-CB7 to transfer metadata about the packet with USER bits contained in respective CB channels during certain UIs shown in FIG. 5, a POISON bit returned from the NVDIMM-P, a CTH bit indicating a credit threshold, and a read identifier RID[0:7] indicating a sequence number, i.e. a TAG, for SEND response packet 520. SEND response packet 520 also provides six bits of ECC data on the CB0-CB5 channels for each UI of a transaction accompanying the write data.

SREAD response packet 530 includes data returned a deterministic time after the memory controller sends an SREAD packet to the NVDIMM-P. The NVDIMM-P buffer, in turn, sends the SREAD response packet if the requested data is in the NVDIMM-P buffer or DRAM cache. If data corresponding to the SREAD is available in the NVDIMM-P buffer or DRAM cache, the NVDIMM-P transfers a valid SREAD response packet with valid data on the DQ bus and the other metadata as indicated. If data corresponding to the SREAD is not available in the NVDIMM-P buffer or DRAM cache, the NVDIMM-P sends an invalid response packet having metadata bit "D_VALID"=0, and the READ DATA0 and READ DATA1 is invalid. The NVDIMM-P will respond to the SREAD command as if it were an XREAD by providing a RD_RDY signal when the requested data is available. SREAD response packet 530 is similar to SEND response packet 520. If the data is available, it will also have a 64-bit data channel DQ0-DQ63 that contains the read data for one data element in four consecutive unit intervals (UIs). Thus two 256-bit read data words READ DATA0 and READ DATA1 are transferred during a single SEND response packet. SREAD response packet 530 uses CB0-CB7 to transfer metadata about the packet, with USER bits contained in respective CB channels during certain UIs shown in FIG. 5, a POISON bit returned from the NVDIMM-P, a CTH bit indicating a credit threshold, metadata bit D_VALID=1. SREAD response packet 530 also provide six bits of ECC data on the CB0-CB5 channels for each UI of a transaction accompanying the write data.

The NVDIMM-P communication protocol supports several other commands whose operation is described in the draft standard. The operation of these commands is not relevant to the present disclosure and will not be discussed further.

Figure 6:
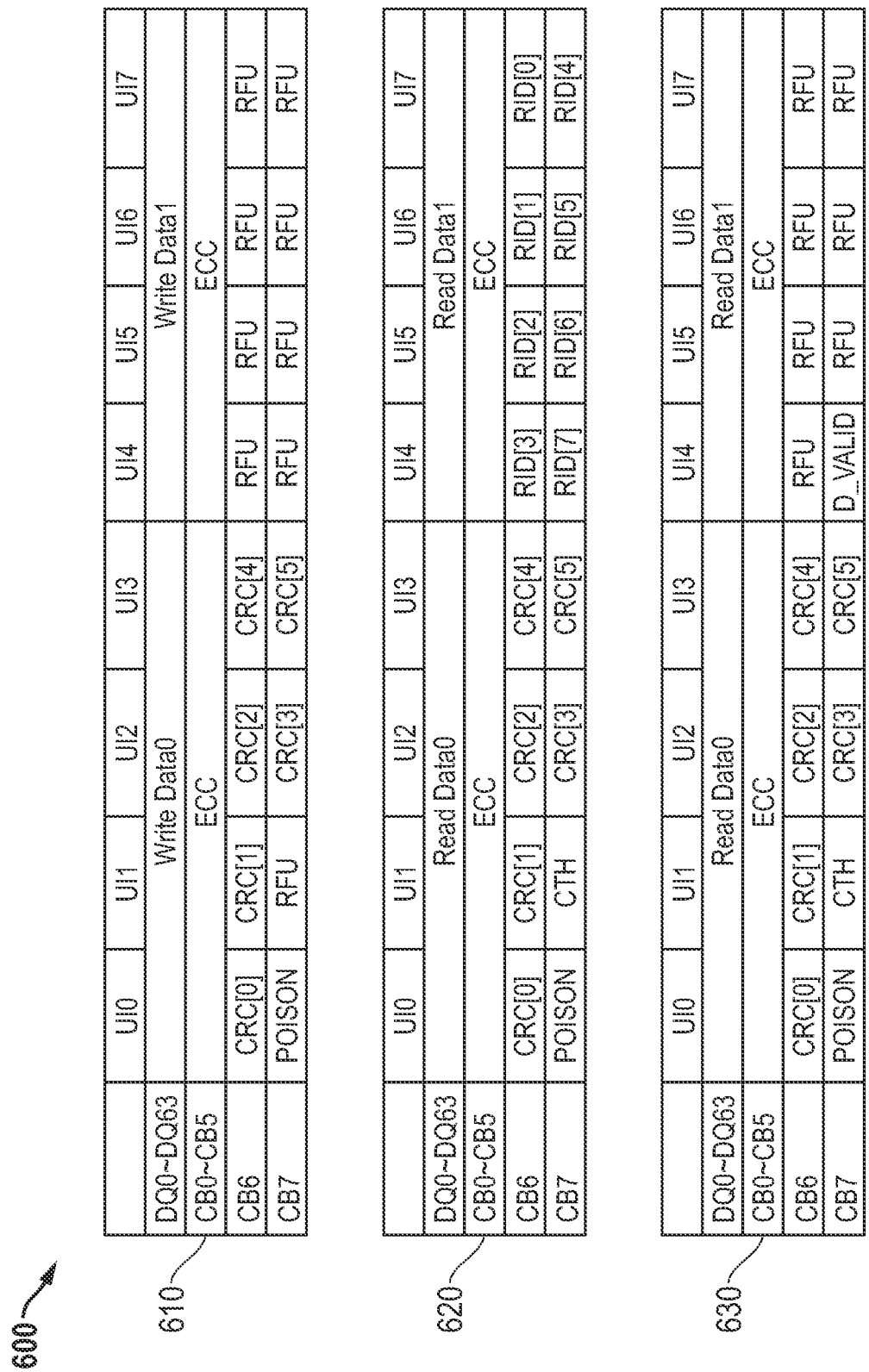
FIG. 6 shows data packet formats for NVDIMM-P memory that support end-to-end data integrity checks according to some embodiments.

FIG. 6 shows data packet formats 600 for NVDIMM-P memory that support end-to-end data integrity checks according to some embodiments. Data packet formats 600 include an XWRITE or PWRITE packet 610, a SEND response packet 620, and an SREAD response packet 530. These packet formats generally correspond to XWRITE or PWRITE packet 510, SEND response packet 520, and SREAD response packet 530, respectively, with one exception. According to some embodiments, the USER bits to support end-to-end data integrity checking. There are 6 USER bits available in "Option B" encoding, and they can be used to store a CRC having $2^6$=64 values. According to one embodiment, memory controller 300 uses the following polynomial to generate the 6-bit CRC:

$$0\times33 = x^6 + x^5 + x^2 + x + 1 \quad [1]$$

It should be apparent that other polynomials are possible. Moreover, if different versions of the NVDIMM-P standard (or any other similar standard) are developed in the future and the relevant packets make more USER bits available, different CRC codes that take advantage of the extra bits can be supported.

Figure 7:
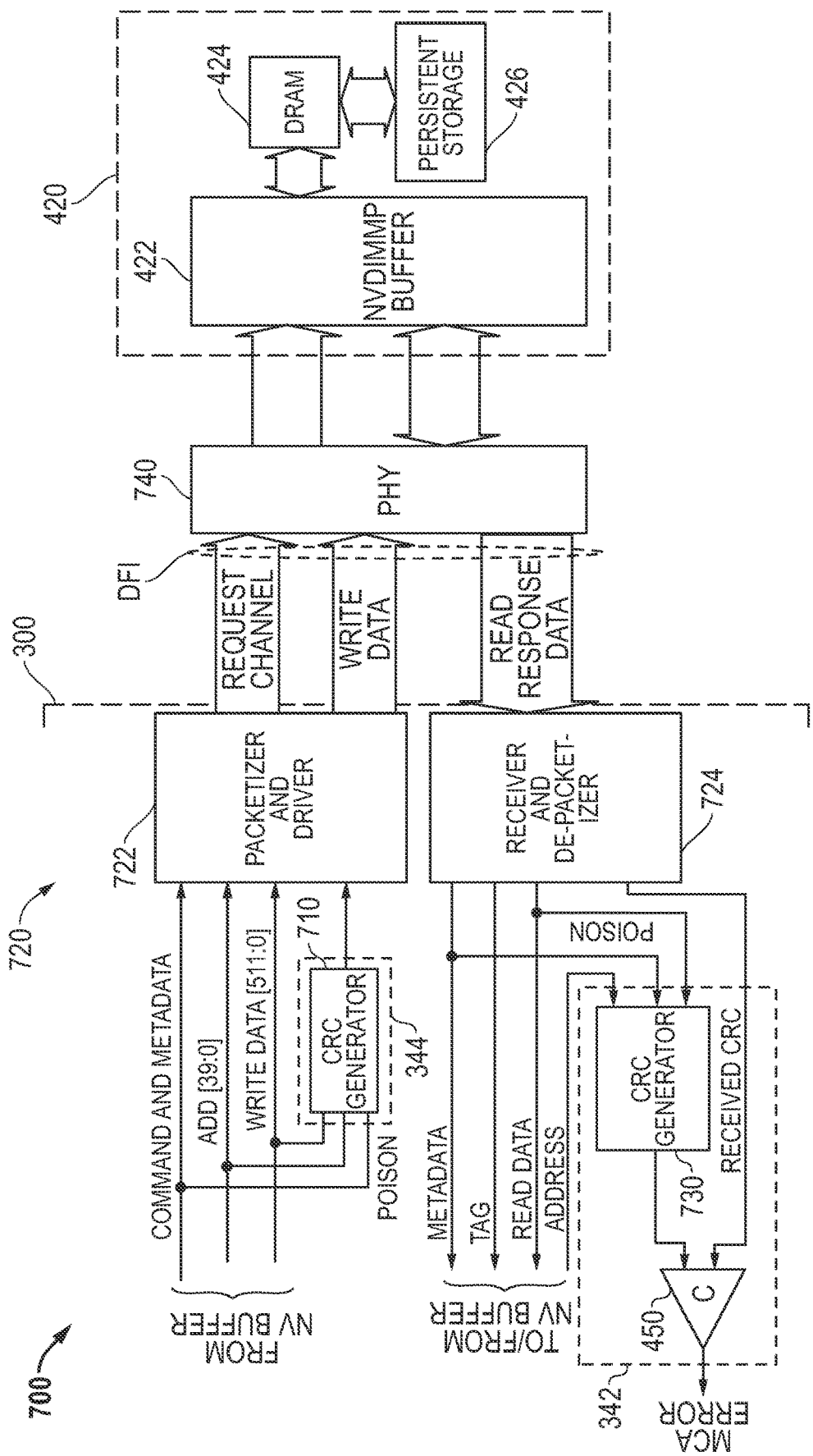
FIG. 7 illustrates in block diagram form a portion of the data processing system of FIG. 2 showing further details of the memory controller and the persistent memory according to some embodiments.

FIG. 7 illustrates in block diagram form a portion 700 of the data processing system of FIG. 2 showing further details of the memory controller and the persistent memory according to some embodiments. In FIG. 7, the memory controller uses other components of the frame, including for example, the POISON bit and/or the ADDRESS bits, to create the CRC as well as DATA [511:0].

Portion 700 is similar to portion 400 of FIG. 4 except that it includes a CRC generator portion 710 of ECC and CRC generation circuit 344, a packetizer and driver 720, a CRC generator 730 of ECC and CRC check circuit 342, and a PHY 740 connected to the memory controller over a DFI bus. In portion 700, CRC generator 710 has a first input for receiving WRITE DATA [511:0], a second input for receiving ADD[39:0], a third input for receiving the COMMAND AND METADATA, and an output connected to packetizer and driver 722. Packetizer and driver 722 forms write packets, such as XWRITE or PWRITE packet 610, as defined by the NVDIMM-P draft standard, but uses WRITE DATA [511:0], ADD[39:0], and COMMAND AND METADATA to generate the CRC. Packetizer and driver 722 places the CRC, so generated, into the USER bits of XWRITE or PWRITE packet 610 as described above. PHY 740 receives the formatted packet from packetizer and driver 722 according to the DFI standard, and drives it onto the heterogeneous DIMM channel 232.

NVDIMM-P buffer 422 receives XWRITE or PWRITE packet 510 and stores it, including the USER bits containing the 6-bit CRC, in an internal buffer, DRAM 424, or persistent storage 426 as appropriate. NVDIMM-P buffer 422 generates SEND response packet 620 or SREAD response packet 630 in response to commands according to the protocol described above. It places the stored USER bits, containing the 6-bit CRC retrieved from an internal buffer, DRAM 424, or persistent storage 426 as the case may be, into the appropriate into bit channels and UIs as shown above, and sends them over the heterogeneous bus.

PHY 740 receives the SEND and SREAD response packets and transmits them to memory controller 300 according to the DFI protocol. Receiver and de-packetizer 724 then separates the METADATA, TAG/RID[0:7], and READ DATA and provides them to the rest of queue and NVDIMM-P sequencer 314. Queue and NVDIMM-P sequencer 314 then sends the ADDRESS corresponding to the TAG/RID[0:7] to CRC generator 730. In portion 700, CRC generator 710 has a first input for receiving the READ DATA [511:0], a second input for receiving ADD[39:0], a third input for receiving the COMMAND AND METADATA, and an output connected to the first input of comparator 450. In the illustrated embodiment, the COMMAND AND METADATA bits that are used in generating the CRC include at least the POISON bit.

According to the draft NVDIMM-P standard, transactions between the memory controller on data processor 210 and NVDIMM-P 238, including the CRC bits, are protected by the Link ECC. Link ECC ensures data integrity for the data transfer between the memory controller and the NVDIMM-P over the memory bus. In accordance with known ECC mechanisms, it protects against data corruption on the link caused by a random or transient error. The protection varies according to the ECC code used. The ECC may allow, for example, single-bit correction with multiple-bit error detection. In response to detecting an uncorrectable error, the memory controller can replay the transaction so that a transient or random error will not persist, and can also report both correctable and uncorrectable errors to the operating system.

While the Link ECC is able to correct some errors by single-bit correction or link replay, multiple-bit errors cannot be corrected through the ECC mechanism alone. Moreover, the ECC mechanism cannot prevent errors that occur on the DIMM, such as a single bit failure in the memory on the NVDIMM-P—either normal high-density DRAM such as DDR4 DRAM, or persistent memory such as any of various types of NVDIMM. The ECC is not stored, but is generated by the NVDIMM-P on a read and checked by the memory controller based on the read data received. Similarly, the ECC is generated and sent by the memory controller and checked by the NVDIMM-P on a write cycle. Thus, there is no end-to-end protection of the data on the DIMM.

In accordance with the various embodiments disclosed herein, however, the memory controller leverages the available metadata bits that are stored in the DIMM to implement end-to-end integrity checking, which is fully compatible with the link ECC mechanism. In particular, the mechanism leverages available bits that are not defined by the JEDEC protocol, known as USER bits, to make this check. The USER bits are significantly limited in number. For example, the "OPTION A" encoding only specifies four USER bits, while the "OPTION B" encoding specifies six user bits. According to some embodiments, the memory controller generates a 6-bit CRC code that is based on all 64 bytes of data and send the CRC code as the USER bits on a write. The NVDIMM-P stores the USER bits in the NVDIMM-P buffer, DRAM cache, or persistent storage as the case may be. According to other embodiments, the memory controller generates a 6-bit CRC code that based on all 64 bytes of data, the address, and some or all of the metadata, and sends the CRC code generated by these bits as the USER bits on a write. The NVDIMM-P stores the USER bits in the array and returns them on a read, such as a SEND or SREAD data packet. The memory controller includes the additional hardware to generate and check the CRC, and no modification of the NVDIMM-P is required beyond storing the USER bits. Note that the memory controller generates the Link ECC to check all the bits of the packet, including the USER/CRC bits.

Thus, a memory controller and data processing system as described herein expands the coverage of data integrity checking to provide end-to-end checking by leveraging a limited number of USER bits that are stored in the NVDIMM-P device and available for comparison when the corresponding data is later read. The checking mechanism uses a 6-bit CRC code that can detect single and multiple bit errors. Moreover, it can co-exist with the Link ECC already present but leverages available bits—the USER bits in the Option B frame formats—to provide a more robust and error free system by adding end-to-end data integrity checking. Thus the Link ECC and CRC checking mechanisms co-exist and provide an overlapping and complementary set of protection mechanisms for enhanced system reliability.

In various embodiments, different portions of the data packet may be used to generate the CRC. In one embodiment, the DATA alone is used. In another embodiment, other bits of the packet including for example the POISON bit and/or the ADDRESS, may be used to create the CRC as well as DATA [511:0]. Moreover, if different versions of the NVDIMM-P standard are developed in the future and the relevant packets make more USER bits available, different CRC codes can be supported. For example, if a future version provided 16 USER bits, a 16-bit CRC could be used instead of the 6-bit CRC in the system described above. The memory controller and data processor may also take various corrective actions in response to a CRC error. These actions include reporting the error to the operating system for further action, or replaying the operation since the CRC error also captures Link ECC errors.

Memory controller 300 of FIG. 3 or any portion thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. Accordingly, it is intended by the appended claims to cover all modifications of the disclosed embodiments that fall within the scope of the disclosed embodiments.

What is claimed is:

1. A data processor for providing memory commands to a memory channel according to predetermined criteria, comprising:
   a first error code generation circuit for generating a first type of error code in response to data of a write request;
   a second error code generation circuit for generating a second type of error code for said write request, said second type of error code different from said first type of error code; and
   a queue coupled to said first error code generation circuit and to said second error code generation circuit, for providing write commands to an interface, said write commands including said data, said first type of error code, and said second type of error code.

2. The data processor of claim 1, further comprising:
   a packetizer and driver for providing said first type of error code in a predetermined error-correcting code (ECC) field of a write data packet, and bits of said second type of error code in corresponding bits of a predetermined user data field of said write data packet.

3. The data processor of claim 2, further comprising:
   a receiver and de-packetizer for extracting read data from a predetermined data portion of a read response packet, and said second type of error code in said predetermined user data field of said write data packet.

4. The data processor of claim 1, wherein:
   said second error code generation circuit generates said second type of error code using said data and an address of said write request.

5. The data processor of claim 1, wherein:
   said second error code generation circuit further generates said second type of error code using metadata of said write request.

6. The data processor of claim 5, wherein:
   said second error code generation circuit generates said second type of error code further in response to a poison bit of said metadata.

7. The data processor of claim 1, wherein:
   said second type of error code comprises a cyclic redundancy check (CRC) code.

8. The data processor of claim 7, wherein:
   said first type of error code comprises an error-correcting code (ECC) with single error correction and multiple error detection.

9. The data processor of claim 8, further comprising:
   a first error code checking circuit for generating said first type of error code in response to read data of a read response packet, and comparing said first type of error code to a first error code received from said memory channel and selectively generating a first type of error signal in response to said comparing; and
   a second error code checking circuit for generating said second type of error code in response to said read data and an address of said read response packet, and comparing said second type of error code to a second error code in said read response packet received from said memory channel and selectively generating a second type of error signal in response to said comparing said second type of error code.

10. A data processing system, comprising:
a memory channel;
a memory coupled to said memory channel; and
a data processor coupled to said memory channel that accesses said memory using a packet structure defining a plurality of commands and having corresponding address bits, data bits, and user bits, said data processor communicating with said memory over said memory channel using a first type of error code, and calculating a second type of error code different from said first type of error code and appending each bit of said second type of error code as a corresponding one of said user bits,
wherein said memory stores said user bits in response to a write command, and transfers said user bits to said data processor in a read response packet in response to a read command.

11. The data processing system of claim 10, wherein:
in response to a read access request, said data processor sends a send packet to said memory, calculates a multi-bit cyclic redundancy check (CRC) code in response to received data of a corresponding read response packet, and compares corresponding user bits from said corresponding read response packet to said multi-bit CRC code, and activates an error signal in response to a difference between said corresponding user bits and said multi-bit CRC code.

12. The data processing system of claim 10, wherein:
said first type of error code comprises a cyclic redundancy check (CRC) code; and
said second type of error code comprises an error-correcting code (ECC).

13. The data processing system of claim 10, wherein said memory comprises a non-volatile dual inline memory module with persistent storage (NVDIMM-P).

14. A method of writing data from a data processor to a memory device on a memory channel, comprising:
receiving a write request;
generating a first type of error code according to said write request;
generating a second type of error code different from said first type of error code according to said write request;
forming a write packet having corresponding address bits, corresponding data bits, corresponding first error code bits of said first type of error code in a predetermined error correcting code (ECC) field, and corresponding second error code bits of said second type of error code in a predetermined user bit field; and
transferring said write packet to the memory device over the memory channel.

15. The method of claim 14, further comprising
determining whether said write packet was correctly received over said memory channel using said first type of error code, and providing an error response if said write packet was not correctly received over said memory channel; and
storing said second type of error code in said memory device.

16. The method of claim 14, wherein:
generating said first type of error code comprises generating an ECC with single error correction and multiple error detection; and
generating said second type of error code comprises generating a cyclic redundancy check (CRC) code.

17. The method of claim 14, wherein:
generating said first type of error code according to said write request comprises generating said first type of error code according to a write address, write data, and a predetermined metadata bit of said write request.

18. The method of claim 14, wherein forming the write packet comprises:
selectively forming the write packet having said corresponding address bits, said corresponding data bits, said corresponding first error code bits in said predetermined error correcting code field, and said corresponding second error code bits in said predetermined user bit field if the memory device is a nonvolatile dynamic access memory with persistent storage (NVDIMM-P).

19. The method of claim 18, further comprising:
receiving a read response packet from the memory device;
generating said first type of error code in response to read data of said read response packet, and comparing said first type of error code to a first error code in said read response packet, and selectively generating a first type of error signal in response to said comparing; and
generating said second type of error code in response to said read data and an address of said read response packet, and comparing said second type of error code to a second error code in said read response packet, and selectively generating a second type of error signal in response to said comparing said second type of error code.

20. The method of claim 19, further comprising:
receiving a read request;
sending a read packet to the memory device in response to said read request;
receiving a response ready packet from the memory device;
sending a send command to the memory device in response to said response ready packet; and
receiving said read response packet after sending said send command.

* * * * *